United States Patent [19]
O'Farrell

[11] Patent Number: 5,204,746
[45] Date of Patent: Apr. 20, 1993

[54] METHOD AND APPARATUS FOR FREQUENCY MODULATING A PHASE LOCKED LOOP WITH VIDEO INFORMATION

[76] Inventor: Scott O'Farrell, 4301 Solberg Ave., Apt. 11, Sioux Falls, S. Dak. 57016

[21] Appl. No.: 664,742

[22] Filed: Mar. 5, 1991

[51] Int. Cl.$^5$ .............................................. H03L 7/00
[52] U.S. Cl. .................................. 358/158; 358/195.1; 358/188
[58] Field of Search ...................... 358/158, 188, 195.1, 358/148, 330, 23, 186; 455/109, 260, 264, 265; 331/11, 10, 1 A; 332/117, 127

[56] References Cited

U.S. PATENT DOCUMENTS

| | | | |
|---|---|---|---|
| 4,442,413 | 4/1984 | Hayashida et al. | 358/195.1 |
| 4,689,685 | 8/1987 | Testin et al. | 358/195.1 |
| 4,698,601 | 10/1987 | Aizawa | 358/158 |

Primary Examiner—Tommy P. Chin
Assistant Examiner—Minsun Oh
Attorney, Agent, or Firm—Edmond T. Patnaude

[57] ABSTRACT

A new and improved method and apparatus, for use in video systems such as VCRs, for frequency modulating a phase locked loop with video information by modulating a video carrier signal with a video signal without alerting the frequency of the sync pulses is disclosed wherein the video modulated carrier signal is sampled during the occurrence of the sync pulses and any difference between the actual sync pulse frequency and a standard sync pulse frequency is used to adjust the frequency of the carrier frequency oscillator to bring the sync pulse frequency to the standard value.

5 Claims, 1 Drawing Sheet and improved method and apparatus for modulating a video
METHOD AND APPARATUS FOR FREQUENCY MODULATING A PHASE LOCKED LOOP WITH VIDEO INFORMATION The present invention relates in general to a new and improved method and apparatus for modulating a video carrier signal with a video signal without altering the frequency of the sync pulses.

BACKGROUND OF THE INVENTION

Phase locked loops are used in many video systems, such, for example, as in present day VCRs where they are used for the generation of FM luminance signals. When the carrier frequency oscillator is part of a phase locked loop, unless the modulating signal is symmetrical, such as a sine wave, the frequencies of the upper and lower sidebands will deviate from the carrier frequency by different amounts. This results from the fact that the average DC level of the modulating signal causes a shift in the carrier frequency toward one or the other of the side bands whereby the frequency of the sync pulses relative to the carrier frequency deviates from the standard frequency required for proper operation of an associated video system.

SUMMARY OF THE INVENTION

Briefly, there is provided in accordance with the present invention a new and improved method and apparatus wherein the video modulated carrier signal is sampled during the occurrence of the sync pulses and any difference between the actual sync pulse frequency and a standard sync pulse frequency is used to adjust the frequency of the carrier frequency oscillator to bring the sync pulse frequency to the standard value.

GENERAL DESCRIPTION OF THE DRAWING

A better and more complete understanding of the present invention will be had from a reading of the following detailed description taken in connection with the accompanying drawings wherein.

DETAILED DESCRIPTION OF A PREFERRED EMBODIMENT

Figure 1:
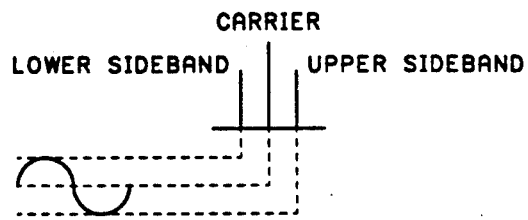
FIG. 1 is a diagrammatic illustration showing the relative frequencies of a frequency modulated carrier and the associated sidebands when the carrier is modulated with a sine wave signal.

Referring particularly to FIG. 1, there is shown the results of modulating a carrier with a sinusoidal modulating signal in a phase locked loop. As may be seen, the modulated carrier signal is made up of the carrier frequency and two sidebands, an upper sideband and a lower sideband. Inasmuch as the average DC level of the modulating signal is zero, the two sidebands are at respective frequencies which are equidistant from the carrier frequency. On the other hand, if the modulating signal is unsymmetrical and thus has an average DC voltage level which is not zero, the carrier frequency will not be centered with respect to the frequencies of the upper and lower sidebands.

Figure 2:
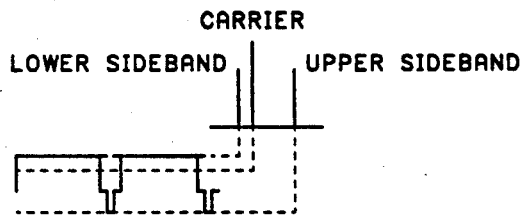
FIG. 2 is a diagrammatic illustration showing the relative frequencies of a frequency modulated carrier and the associated sidebands when the carrier is modulated with a video signal.

With reference to FIG. 2., the modulating signal is shown to be a pure white video signal having an average DC voltage level greater than zero. Consequently, the carrier frequency is closer to the frequency of the lower sideband than it is to the frequency of the upper sideband. The phase locked loop will maintain the carrier at the prescribed frequency causing the frequencies of the upper and lower sidebands to deviate from the prescribed values. This presents a problem with respect to the horizontal sync signal and more particularly with respect to the system using that signal.

Figure 3:
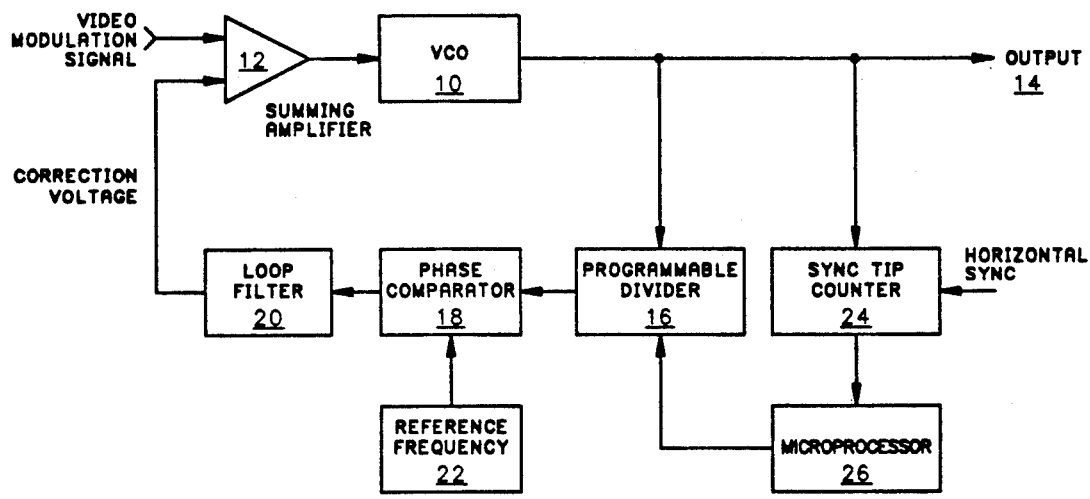
FIG. 3 is a block diagram of a frequency modulator circuit embodying the present invention.

Referring to FIG. 3, a phase lock loop frequency modulating circuit may be seen to include a voltage controlled oscillator 10 having an output frequency which is under the control of a DC voltage applied to the input of the oscillator 10 from the output of a summing amplifier 12 to one input of which the video modulation signal is applied. The frequency modulated signal from the oscillator 10 is connected to the output terminal 14 with a portion thereof being applied to one input of a programmable frequency divider 16 having its output connected to one input of a divider 16 having its output connected to one input of a phase comparator 18. The output of the phase comparator 18 is fed through a loop filter 20 to a second input of the summing amplifier 12. The second input of the phase comparator 18 is supplied with a constant frequency reference signal from a suitable source 22 of a reference frequency. The portion of the circuit shown in FIG. 3 and described thus far is a typical phase locked loop frequency modulating system. Assuming that the carrier frequency is at 100 MHz, the reference frequency from the source 22 is set at 100 KHz, and the divider 16 is set to divide the output frequency from the oscillator 10 by one-thousand and compare the resultant frequency with the reference frequency. The phase comparator produces a DC correction voltage having a level which is proportional to the difference between these two frequencies.

The correction voltage is algebraically added to the video modulating signal in the summing amplifier and applied to the input of the voltage controlled oscillator to frequency modulate the 100 MHz carrier. The amount of deviation of the sidebands from the carrier is thus set by the summing ratio of the average DC voltage level of the video modulation signal to the level of the correction voltage. The modulated carrier will be perceived by the phase locked loop to be at an erroneous frequency because of the non-symmetrical video waveform, and it will cause a shift in the operating frequency of the oscillator 10. The result would be a shift in the frequency of the sync pulses in the video modulated output signal.

In order to correct the horizontal sync pulse rate in the video modulated signal appearing at the output terminal 14, a portion of the video modulated output from the oscillator is connected to the input of a gated sync tip counter 24. The sync tip counter 24 is gated by the horizontal sync signal from the video modulation signal so that the signal at the output terminal 14 is counted only during the sync period. The count is made over a predetermined number of lines and that number is then processed by a microprocessor 26 to determine if the sync tip frequency is correct or not. If not, the microprocessor adjusts the value of the divider of the programmable frequency divider 16 to adjust the average output frequency of the oscillator 10 up or down to bring the sync tip frequency to the set value.

Figure 4:
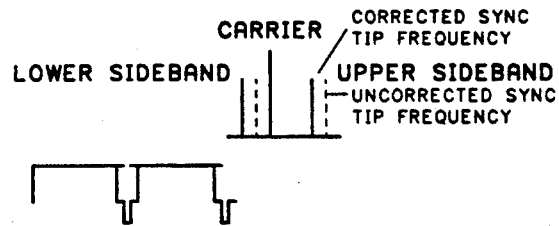
FIG. 4 is a diagrammatic illustration showing the effect on the relative frequencies of the frequency modulated carrier and the associated sidebands resulting from the use of the present invention.

Referring to FIG. 4, there is shown the results of the invention on the sync tip frequency in the video modulated output signal from the oscillator 10. As may be seen, by means of the system of the present invention the frequencies of the upper and lower sidebands have been shifted from the positions shown in dotted lines to the positions shown in full lines where they are equidistant from the carrier frequency whose frequency remains at 100 MHz.

In conclusion, it will be understood that the present invention permits the use of a phase locked loop to control the frequency of a video modulated voltage controlled oscillator while keeping the horizontal sync pulse rate at the set point.

While the present invention has been described in connection with a particular embodiment thereof, it will be understood by those skilled in the art that many changes and modifications may be made therein without departing from the true spirit and scope of the invention. Therefore, it is intended by the appended claims to cover all such changes and modifications which come within the true spirit and scope of the invention.

What is claimed is:

1. A method of frequency modulating a video carrier with a video signal including periodic sync pulses, comprising the steps of
   providing a voltage controlled oscillator which oscillates at the video carrier frequency,
   using said video signal to vary the frequency of said oscillator in proportion to the amplitude of said video signal to provide a video modulated output signal including periodic sync pulses,
   sampling the video modulated output signal from said oscillator,
   dividing the frequency of said video modulated output signal by an adjustable divisor to produce a frequency divided signal,
   comparing said frequency divided signal to a constant reference frequency to produce a DC voltage proportional to the difference between the frequency of said output signal and said reference frequency,
   adding said DC voltage to said video signal and using the combined signal to control the operating frequency of said oscillator,
   comparing the rate of said sync pulses in said video modulated output signal to a reference sync rate, and
   adjusting the divisor of said divider in proportion to the difference between said rate of said sync pulses in said video modulated output signal and said reference sync rate,
   whereby the frequency of said sync pulses remains the same as said reference sync rate irrespective of changes in the average DC level of said video signal.

2. In a frequency modulation system including a voltage controlled oscillator and a phase locked loop connected between the output and the input of said oscillator to control the output frequency thereof, comprising in combination
   a programmable frequency divider connected in said phase locked loop,
   sync tip counter means for comparing the frequency of a component of the output signal from said oscillator with a horizontal sync signal and adjusting the divisor of said programmable frequency divider in response to a change in the frequency of said component to adjust the frequency of said component.

3. The system of claim 2 wherein said component is a series of periodic sync pulses.

4. The system of claim 2 wherein said component is a series of horizontal sync pulses.

5. The system according to claim 2 wherein a video signal including periodic sync pulses is applied to said oscillator to frequency modulate the output of said oscillator.

* * * * *

UNITED STATES PATENT AND TRADEMARK OFFICE
CERTIFICATE OF CORRECTION

PATENT NO. : 5,204,746
DATED     : April 20, 1993
INVENTOR(S) : Scott O'Farrell

It is certified that error appears in the above-identified patent and that said Letters Patent is hereby corrected as shown below:

In column 4, line 24, after "divider"

insert --having an adjustable divisor--

Signed and Sealed this

Eighth Day of February, 1994

Attest:

BRUCE LEHMAN

Attesting Officer

Commissioner of Patents and Trademarks